United States Patent
Mehrotra et al.

(10) Patent No.: US 8,473,533 B1
(45) Date of Patent: Jun. 25, 2013

(54) METHOD AND APPARATUS FOR HARMONIC BALANCE USING DIRECT SOLUTION OF HB JACOBIAN

(75) Inventors: Amit Mehrotra, Mountain View, CA (US); Abhishek Somani, Kolkata (IN)

(73) Assignee: Berkeley Design Automation, Inc., Santa Clara, CA (US)

( * ) Notice: Subject to any disclaimer, the term of this patent is extended or adjusted under 35 U.S.C. 154(b) by 425 days.

(21) Appl. No.: 12/818,032

(22) Filed: Jun. 17, 2010

(51) Int. Cl.
*G06F 7/00* (2006.01)
(52) U.S. Cl.
USPC .......................................... 708/200; 708/514
(58) Field of Classification Search
None
See application file for complete search history.

(56) References Cited

U.S. PATENT DOCUMENTS

| | | | |
|---|---|---|---|
| 7,577,547 B2 * | 8/2009 | Subramaniam | 702/167 |
| 2009/0292520 A1 * | 11/2009 | Nwankpa et al. | 703/18 |
| 2010/0082724 A1 * | 4/2010 | Diyankov et al. | 708/520 |

* cited by examiner

*Primary Examiner* — Chuong D Ngo
*Assistant Examiner* — Michael D Yaary
(74) *Attorney, Agent, or Firm* — Fenwick & West LLP

(57) ABSTRACT

A system, computer-readable storage medium, and method directly solves non-linear systems that have the HB Jacobian as the coefficient matrix. The direct solve method can be used to efficiently simulate non-linear circuits in RF or microwave applications. Additionally, the direct solve method can be applied to Fourier envelope applications. Furthermore, the direct solve method can be used together with preconditioners to provide a more efficient iterative solve technique.

20 Claims, 6 Drawing Sheets

Block Aij has size (2k+1) × (2k+1) entries $J_{hb} =$ n blocks = n(2k+1) rows n blocks = n(2k+1) cols

FIG. 5

$$\begin{bmatrix} A_{11} & A_{12} \\ A_{21} & A_{22} \end{bmatrix}$$

FIG. 6

METHOD AND APPARATUS FOR HARMONIC BALANCE USING DIRECT SOLUTION OF HB JACOBIAN

TECHNICAL FIELD

The present invention relates to computer-aided analysis of non-linear systems and, more specifically, to computer-aided harmonic balance analysis.

BACKGROUND OF THE INVENTION

Harmonic balance analysis (HB) is a popular method for simulating RF and microwave circuits. For circuits where the nonlinearities are moderate and the signal transitions are not very sharp, HB analysis is preferred over time-domain techniques because HB analysis gives unmatched performance and accuracy. HB analysis is particularly useful in RF and microwave applications because these applications rely heavily on measured frequency domain data such as s-parameters of linear networks. Unlike time-domain techniques, HB analysis can be used for direct simulation in the frequency domain without requiring expensive convolutions or fitting.

The drawback of traditional HB implementations is that the underlying HB Jacobian is often large and not very sparse. This makes the HB Jacobian very inefficient to factor and solve directly. Conventional HB implementations separate the linear and nonlinear portions of the circuit and formulate the problem so as to achieve balance between the harmonics of the waveforms of the two portions (hence the name harmonic balance). Since there is no coupling between harmonics in the linear portion, the linear portion can be arbitrarily large. Thus, the limitation of this approach is the size and nonlinearity of the portion containing the nonlinear elements.

One traditional approach to addressing these limitations uses Krylov subspace methods. These iterative methods do not require the HB Jacobian matrix to be explicitly formed, let alone factored. Instead Krylov subspace methods require that the matrix-vector product is formed at each iteration. Matrix-vector products with the HB Jacobian can be formed efficiently using a series of Fast Fourier Transforms (FFTs) and sparse matrix vector multiplications with circuit matrices. Iterative methods such as Krylov subspace methods tend to be increasingly useful with increasing circuit sizes. Therefore, conventional simulators restrict the use of a direct solution method to small circuits, and use Krylov methods for more complex circuits.

However, the effectiveness of Krylov subspace methods to the harmonic balance problem critically depends on selecting appropriate preconditioners. Otherwise, the number of iterations becomes prohibitively large. In addition, as the complexity and nonlinearity of circuits increases, Krylov subspace based HB engines require more advanced preconditioners and still require a large number of iterations to reliably solve the system of linear equations. In many cases, the conventional methods are unable to solve the system at all. Therefore, a robust and efficient harmonic balance solution is still needed.

SUMMARY OF THE INVENTION

A simulation system, computer-readable storage medium, and computer-implemented method factors a Jacobian matrix into a lower triangular component L and an upper triangular component U. A simulation system receives a Jacobian matrix having n rows of blocks and n columns of blocks. Each block $A_{ij}$ of the Jacobian matrix comprises a sub-matrix of numerical entries. The simulation system generates a test matrix Z having n rows and n columns of representative numerical entries. The representative numerical entries $z_{ij}$ in the test matrix Z are each determined as a function of a corresponding block $A_{ij}$ in the Jacobian matrix. The simulation system performs an LU factorization on the test matrix Z to derive a lower triangular component $L_Z$ and an upper triangular component $U_Z$. For each non-zero entry in $L_Z$ the simulation system determines a corresponding block in the lower triangular component L of the Jacobian matrix. For each non-zero entry in $U_Z$ determining, the simulation system determines a corresponding block in the upper triangular component U of the Jacobian matrix. The simulation system then outputs the lower and upper triangular factors L and U.

In a first embodiment, the described direct factorization technique is used to simulate a non-linear circuit. A simulation system receives a Jacobian matrix for a harmonic balance equation describing the non-linear circuit with at least one unknown state variable. Using a test matrix representative of the structure of the Jacobian matrix, the simulation system determine the locations of zero and non-zero entries in the lower triangular factor L and the upper triangular factor U of the Jacobian matrix. The simulation system then factors the Jacobian matrix into its lower triangular factor L and upper triangular factor U by solving only for entries in the L and U matrices determined to be the non-zero entries. The simulation system bypasses calculations on the entries determined to be the zero entries, thereby providing a computationally efficient solution. The simulation system then solves the harmonic balance equation for the at least one unknown state variable using the lower triangular factor L and the upper triangular factor U in an LU decomposition method.

In a second embodiment, the described direct factorization technique is applied to a Fourier envelope analysis problem. In this embodiment, the simulation system receives parameters of a multi-rate matrix equation representative of the Fourier envelope analysis. The simulation system generates the Jacobian matrix for the multi-rate matrix. The multi-rate matrix equation is then solved using the direct solve technique described above.

In a third embodiment, the direct factorization technique is used in combination with preconditioners as part of an iterative solver.

Advantageously, the claimed invention provides substantially improved robustness and computational efficiency over the conventional techniques.

BRIEF DESCRIPTION OF THE DRAWINGS

The teachings of the present invention can be readily understood by considering the following detailed description in conjunction with the accompanying drawings. Like reference numerals are used for like elements in the accompanying drawings.

FIG. 5 is an example of a Jacobian matrix structure that can be efficiently factored using an embodiment of the present invention.

FIG. 6 is a matrix structure that can be iteratively factoring using an embodiment of the present invention.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

A embodiment of the present invention is now described with reference to the figures where like reference numbers indicate identical or functionally similar elements. Also in the figures, the left most digit of each reference number corresponds to the figure in which the reference number is first used.

Overview

A, system, computer-readable storage medium, and method is disclosed for directly solving non-linear systems that have the HB Jacobian as the coefficient matrix. Unlike conventional techniques, a highly specialized direct solver exploits the unique structure of the HB Jacobian. Compared to the best preconditioned Krylov subspace methods, the direct solver of the present invention gives at least competitive performance on systems with mild nonlinearities, and far superior performance and robustness for systems with moderate to strong nonlinearities. Furthermore, the specialized direct solver gives far superior performance compared to a generic sparse direct solver.

In a first embodiment, the direct solver is configured to simulate non-linear circuits for RF or microwave applications. In a second embodiment, the direct solver is applied to Fourier envelope applications. Here, the direct solver lends itself very naturally to Jacobian bypass and therefore gives additional performance advantages over conventional simulation techniques. In a third embodiment, the direct solver is used together with new preconditioners for iterative methods. These preconditioners provide a trade-off between performance and memory, and in some cases they provide both speed and memory improvements over conventional techniques.

System Architecture

Figure 1:
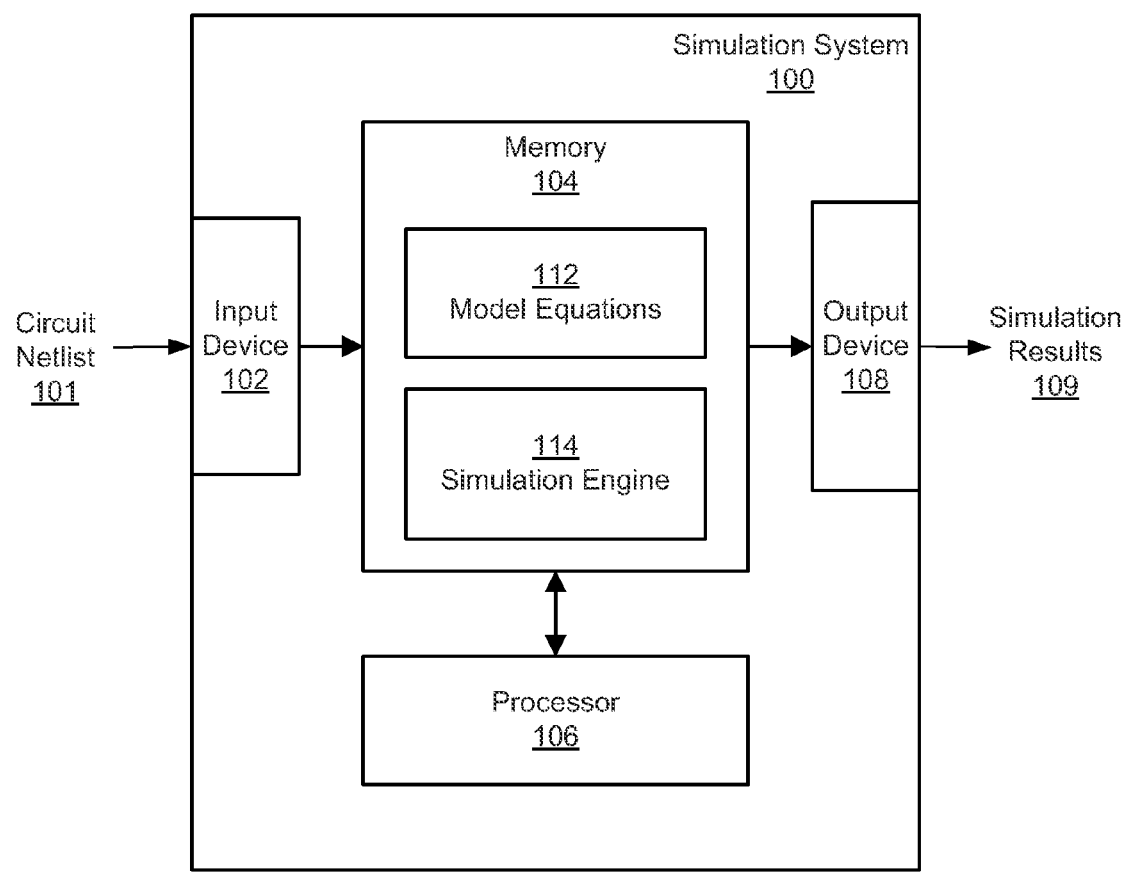
FIG. 1 is a block diagram illustrating a simulation system according to one embodiment of the present invention.

FIG. 1 is a block diagram illustrating a simulation system 100 according to one embodiment of the invention. The simulation system 100 comprises an input device 102, a memory 104, a processor 106, and an output device 108.

The processor 106 processes data signals and may comprise various computing architectures such as a complex instruction set computer (CISC) architecture, a reduced instruction set computer (RISC) architecture, or an architecture implementing a combination of instruction sets. Although only a single processor 106 is shown in FIG. 1, multiple processors may be included. The processor 106 may comprises an arithmetic logic unit, a microprocessor, a general purpose computer, or some other information appliance equipped to transmit, receive and process electronic data signals from the memory 104, the input device 102, or the output device 108.

The input device 102 is any device configured to provide input to the simulation system 100. For example, the input device 102 may be used to input a circuit netlist 101 to the system 100 using external user devices such as a keyboard, a mouse, etc. Alternatively, the input device 102 can import a netlist 101 from an external network or database. The output device 108 represents any device equipped to output processed data to, for example, an external storage device, a network, or a display. For example, the output device 108 may output the simulation results 109 from the simulation system 100.

The memory 104 comprises a computer-readable storage medium that stores computer-executable instructions and computer-readable data. The instructions may comprise code for performing any and/or all of the techniques described herein. The memory 104 furthermore stores data inputted via input device 102, data to be outputted by output device 108, and any intermediate data used to carry out the process steps of the simulation engine 114 described herein. Memory 104 may be a dynamic random access memory (DRAM) device, a static random access memory (SRAM) device, Flash RAM (non-volatile storage), combinations of the above, or some other memory device known in the art. In operation, the processor 106 loads the computer-executable instructions and/or data from the memory 104 to carry out the process steps described herein.

In one embodiment, the memory 104 stores a computer simulation engine 114 and model equations database 112. The model equations database 112 stores analytical models modeling the behavior of a variety of circuit components (e.g., capacitor, inductors, transistors, diodes, etc.) that are typically included in electronic circuits, for use in generating equations representing the circuit to be simulated. The circuit simulation engine 114 stores computer-executable program instructions that when executed by the processor 106, cause the simulation system 100 to receive the circuit netlist 101 describing the nodes and connections of the electronic circuit to be simulated, generate equations representing the circuit based on the netlist 101 and the model equations stored in database 112, and execute a variety of algorithms for solving the equations. For example, in one embodiment, the simulation engine 114 provides computer-executable program instructions for performing harmonic balance analysis in order to determine at least one initially unknown voltage or current in the circuit described by the netlist 101.

The simulation system 100 may include more or less components than those shown in FIG. 1 without departing from the scope of the present invention. For example, computer system 100 may include additional memory, such as, for example, a first or second level cache, or one or more application specific integrated circuits (ASICs).

Overview of Harmonic Balance Analysis

Figure 2:
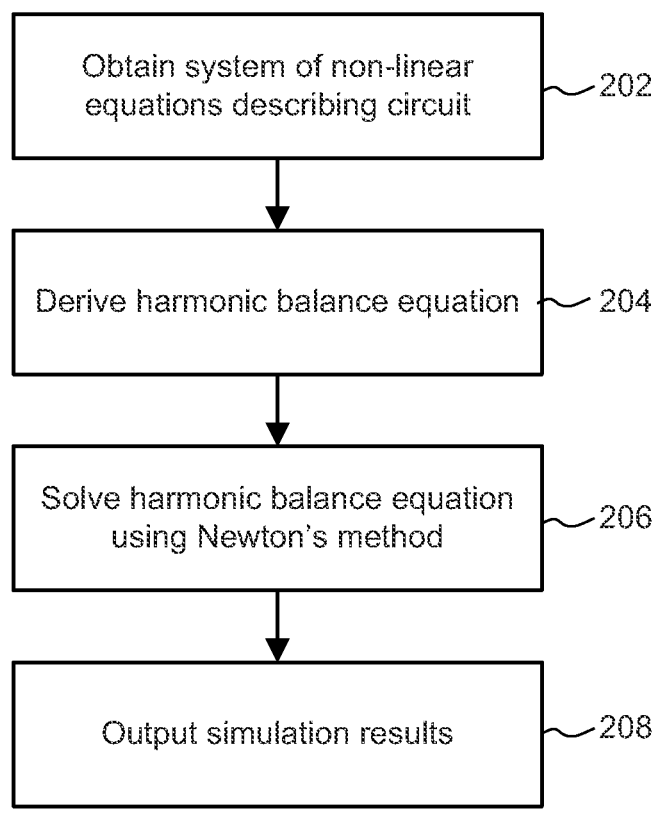
FIG. 2 is a flowchart illustrating a method for simulating a circuit according to one embodiment of the present invention.

FIG. 2 is a flowchart illustrating a method performed by the simulation system 100 for simulating a non-linear circuit using harmonic balance analysis. A system of non-linear differential equations is obtained 202 describing the circuit for simulation. For example, in one embodiment, the simulation system derives the equations from the circuit netlist 101 based on the model equations 112. Assuming the circuit is non-autonomous, the circuit can be described by a matrix equation having the general form:

$$\int_{-\infty}^{t} y(t-s)x(s)\,ds + \frac{dq(x(t))}{dt} + f(x(t)) + b(t) = 0 \qquad (1)$$

where $x(t) \in \mathbb{R}^n$ represents the state variables in the circuit, n is the circuit size, y represents the matrix-valued impulse response function of frequency-domain linear elements (such as s parameters), $q: \mathbb{R}^n \to \mathbb{R}^n$ represents the nonlinear charge and flux storage in the circuit, $f: \mathbb{R}^n \to \mathbb{R}^n$ represents the memoryless nonlinearities and $b: \mathbb{R} \to \mathbb{R}^n$ represents the time-dependent excitations in the circuit which are assumed to be periodic with period T.

The simulations system 100 derives 204 a harmonic balance equation from the system of equations in (1). Since the circuit is non-autonomous, the circuit steady state response x(t) will also be periodic with period T and its functions q(x) and f(x) are also T-periodic. Therefore all these waveforms can be expanded in Fourier series as follows:

$$b(t) = \sum_{i=-\infty}^{\infty} B_i \exp(j2\pi i f_0 t), \quad x(t) = \sum_{i=-\infty}^{\infty} X_i \exp(j2\pi i f_0 t) \quad (2)$$

$$f(t) = \sum_{i=-\infty}^{\infty} F_i \exp(j2\pi i f_0 t), \quad \text{and} \quad q(t) = \sum_{i=-\infty}^{\infty} Q_i \exp(j2\pi i f_0 t)$$

where $$f_0 = \frac{1}{T}.$$

Substituting the Fourier series in (2), Eq. (1) can be written in frequency-domain as:

$$\sum_{i=-\infty}^{\infty} [Y_i X_i + j2\pi i f Q_i + F_i + B_i] \exp(j2\pi i f t) = 0 \quad (3)$$

where $Y(f) = \int_{-\infty}^{\infty} y(t) \exp(-j2\pi ft) dt$ is the Fourier transform of y(t) and $Y_i = Y(if_0)$. Since $\exp(j2\pi i f_0 t)$ are orthogonal, it follows that:

$$Y_i X_i + j2\pi i f_0 Q_i + F_i + B_i = 0 \quad (4)$$

∀i. The infinite summations can be truncated to a finite number of harmonics k. Collocating the above equation at i∈[-k,k] yields:

$$Y_{-k} X_{-k} + j2\pi(-k)f_0 Q_{-k} + F_{-k} B_{-k} = 0$$

$$Y_0 X_0 + j2\pi 0 f_0 Q_0 + F_0 + B_0 = 0$$

$$Y_k X_k + j2\pi k f_0 Q_k + F_k + B_k = 0 \quad (5)$$

In matrix form, the harmonic balance equation is given by:

$$F_{hb} = yx + j2\pi f_0 \Omega Q + F + B = 0 \quad (6)$$

where, $\Omega = \text{diag}([-kI \ldots 0 \ldots kI])$ and $$Q = [Q_{-k}, \ldots, Q_0, \ldots, Q_k]^T \quad (7)$$

B, F and X are similarly defined, and $$y = \text{diag}[Y_{-k} \ldots 0 \ldots Y_k] \quad (8)$$

The harmonic balance equation in (6) represents a system of m(2k+1) nonlinear equations in m(2k+1) unknowns X.

The harmonic balance equation in (6) is solved 206 using Newton's method. Newton's method is a iterative algorithm that finds successively better approximations to the roots of an equation. As applied to the harmonic balance equation $F_{hb}$, an initial guess $X_0$ is made for the vector of unknowns X. According to Newton's method, a better approximation $X_1$ is computed by solving the following matrix equation:

$$J_{hb}(\Xi_0)(\Xi_1 - \Xi_0) = -F_{hb}(\Xi_0) \quad (9)$$

where $J_{hb}$ is the harmonic balance Jacobian given by:

$$J_{hb} = \mathcal{Y} + j2\pi i f_0 \Omega \frac{\partial \mathcal{Q}}{\partial \mathcal{X}} + \frac{\partial \mathcal{F}}{\partial \mathcal{X}} \quad (10)$$

Generalizing to n+1 iterations, the following equation is iteratively solved to yield successively better approximations for X:

$$J_{hb}(\Xi_n)(\Xi_{n+1} - \Xi_n) = -F_{hb}(\Xi_n) \quad (11)$$

At each iteration, Eq. (11) can be efficiently solved using an LU decomposition method. An embodiment of a process for efficiently factoring the HB Jacobian $J_{hb}$ using a direct solver is described in further detail below with respect to FIG. 4. The simulation system 100 then outputs 208 the simulation results 109.

Representative Example Using Simple Rectifier Circuit

Figure 3:
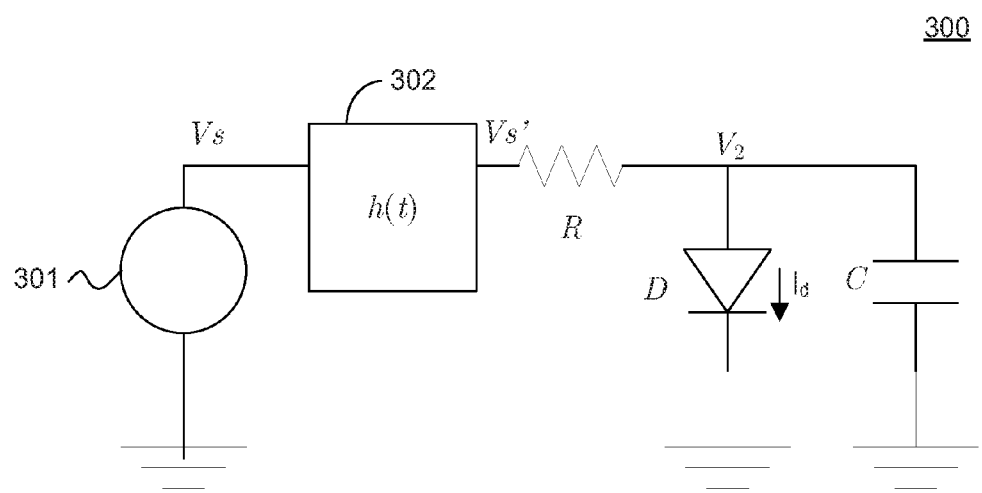
FIG. 3 is a circuit diagram illustrating a rectifier circuit that can be simulated using an embodiment of the present invention.

FIG. 3 illustrates one example of a circuit 300 that can be simulated using the simulation system 100. A simple rectifier circuit 300 comprises a voltage source 301 generating a voltage $V_S$, a linear structure 302 having a measured impulse response h(t), a resistor R, a diode D, and a capacitor C. In this example, the simulation system 100 receives a netlist 101 describing the circuit 300 and outputs the initially unknown voltages $V_S$, $V_S'$, and $V_2$ in the simulation results 109.

The diode current through diode D is given by:

$$I_d = I_s \left[ \exp\left(\frac{-V_2}{\upsilon_T}\right) - 1 \right] + \frac{d\tau I_s \left[ \exp\left(\frac{-V_2}{\upsilon_T}\right) - 1 \right]}{dt} \quad (12)$$

where $I_S$, $\upsilon_T$ and τ are constants based on the diode characteristics. Kirchoff's current law (KCL) states that the net current flowing into a node is equal to the net current flowing out of the node. Applying KCL at node $V_2$, the following equation can be derived:

$$\frac{V_2 - V_{S'}}{R} + I_s \left[ \exp\left(\frac{-V_2}{\upsilon_T}\right) - 1 \right] + \frac{d\tau I_s \left[ \exp\left(\frac{-V_2}{\upsilon_T}\right) - 1 \right]}{dt} + \frac{dCV_2}{dt} = 0 \quad (13)$$

The linear structure 302 receives the input voltage $V_S$ and outputs a voltage $V_S'$ as a function of $V_S$ according to the following equation:

$$-V_{s'} + \int_{-\infty}^{t} h(t-s) V_s(s) ds = 0 \quad (14)$$

The voltage source $V_S$ is a sinusoid of frequency f. Therefore, the following equation can also be derived:

$$V_s - \sin(2\pi f t) = 0 \quad (15)$$

The equations in (13)-(15) can be re-written in the generalized matrix form of

Eq. (1), where (16)

$$x = \begin{bmatrix} V_2 \\ V_s' \\ V_s \end{bmatrix} \text{ and:}$$

$$q = \begin{bmatrix} CV_2 + \tau I_s\left[\exp\left(\frac{-V_2}{v_T}\right) - 1\right] \\ 0 \\ 0 \end{bmatrix}$$

$$f = \begin{bmatrix} \frac{V_2 - V_{s'}}{R} + I_s\left[\exp\left(\frac{-V_2}{v_T}\right) - 1\right] \\ -V_{s'} \\ V_s \end{bmatrix}$$

$$y = \begin{bmatrix} 0 & 0 & 0 \\ 0 & 0 & h \\ 0 & 0 & 0 \end{bmatrix}$$

$$b = \begin{bmatrix} 0 \\ 0 \\ -\sin(2\pi f t) \end{bmatrix}$$

The most natural way of describing y is in terms of its Fourier transform:

$$H(f) = \int_{-\infty}^{\infty} h(t)\exp(-j2\pi ft)dt \quad (17)$$

H(f) is typically measured using standard instruments and may comprise tabulated values of frequency f. Since the circuit is non-oscillatory, in steady-state, all the waveforms $V_2$, $V_S$, $V_S'$, f, q will be periodic with frequency f and therefore can be written in Fourier series similarly to Eq. (2) above as:

$$V_2(t) = \sum_{i=-\infty}^{\infty} V_{2_i}\exp(j2\pi ift) \quad (18)$$

$$V_{s'}(t) = \sum_{i=-\infty}^{\infty} V_{s'_i}\exp(j2\pi ift)$$

$$V_s(t) = \sum_{i=-\infty}^{\infty} V_{s_i}\exp(j2\pi ift)$$

$$f(t) = \sum_{i=-\infty}^{\infty} F_i\exp(j2\pi ift)$$

$$q(t) = \sum_{i=-\infty}^{\infty} Q_i\exp(j2\pi ift)$$

$$b(t) = \sum_{i=-\infty}^{\infty} B_i\exp(j2\pi ift)$$

The harmonic balance equation and harmonic balance Jacobian can then be derived following Eqs. (3)-(11) described above.

While the circuit in FIG. 3 and the above description provides on example of a circuit that can be simulated according to the methods of the present invention, the described techniques can apply to any non-linear circuit that can be described in the general form of Eq. (1) by applying the principles described above.

Direct Solution of HB Jacobian

As previously described, the solution to the harmonic balance equation in (6) involves performing an LU factorization on the HB Jacobian $J_{hb}$. Beginning with Eq. (10) above, it can be easily shown that:

$$J_{hb} = y + j2\pi f_0 \Omega \Gamma C \Gamma^{-1} + \Gamma G \Gamma^{-1} \quad (19)$$

where $$C = \begin{bmatrix} C(t_1) & 0 & 0 \\ 0 & \ddots & 0 \\ 0 & 0 & C(t_{2k+1}) \end{bmatrix} \quad (20)$$

where $$C(t_i) \frac{dq}{dx}\bigg|_{x(t_i)}.$$

G is also similarly defined. $\Gamma$ represents time to frequency translation and consists of a series of permutations and Fourier transforms. The Jacobian $J_{hb}$ is large and not very sparse. Therefore a generic dense or sparse solver will not be able to solve this system very efficiently. Note that:

$$\Gamma C \Gamma^{-1} = \begin{bmatrix} C_0 & C_1 & \ldots & C_{-k} \\ C_{-k} & C_0 & C_1 & \ldots \\ & & \ddots & \\ C_1 & C_2 & \ldots & C_{-k} & C_0 \end{bmatrix} \quad (21)$$

where $C_i$ is the ith Fourier coefficient of C(t). I.e., the matrix block-circulant. The structure of $J_{hb}$ is similar to (21) except that it is not block circulant as $\Gamma C \Gamma^{-1}$.

Figure 4:
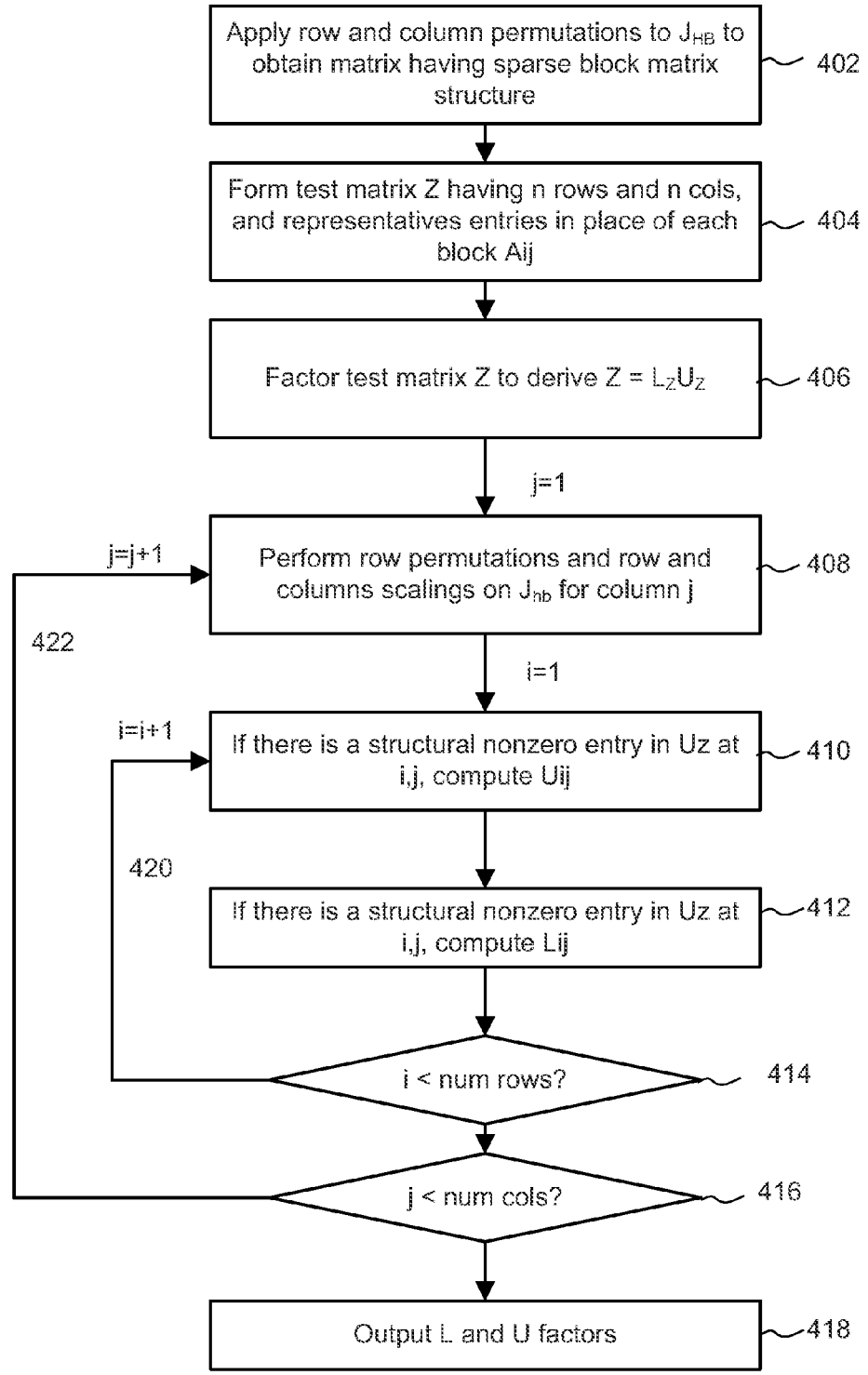
FIG. 4 is a flowchart illustrating a method for directly factoring a Jacobian matrix according to one embodiment of the present invention.
Figure 5:
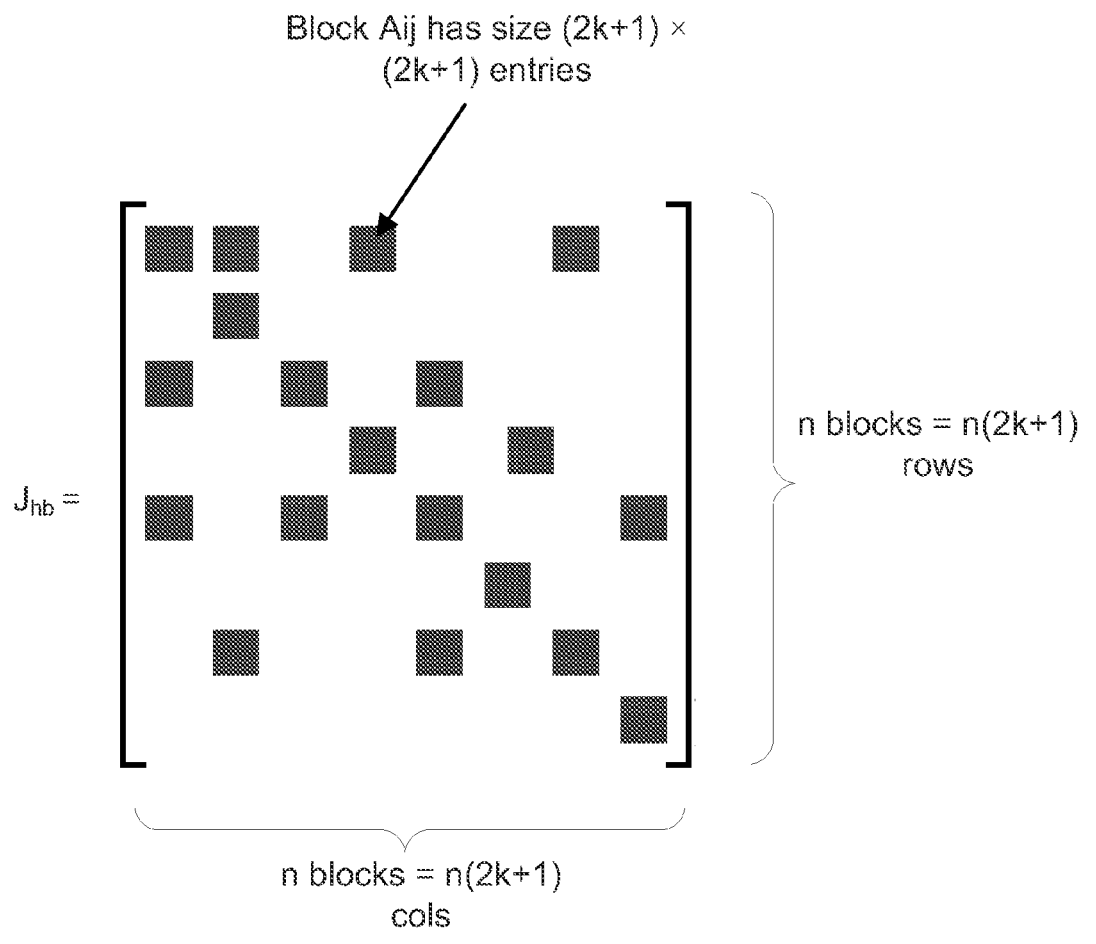

FIG. 4 is a flowchart illustrating an embodiment of a process for determining the L and U factors of the HB Jacobian $J_{hb}$. Various row and column permutations and scalings are applied 402 to $J_{hb}$ such that all harmonics of a single variable are grouped together. At the top level, the matrix will have the same sparsity structure as the Jacobian matrix obtained during time-domain numerical integration of Eq. (1), also known as "transient Jacobian," except that in the transient Jacobian, each entry is a number whereas in this matrix, each "entry" $A_{ij}$ is a block matrix of size (2k+1)×(2k+1). An example matrix in this sparse block form is illustrated in FIG. 5. The matrix $J_{hb}$ has n rows of blocks and n columns of blocks, where each block $A_{ij}$ is a matrix of (2k+1)×(2k+1) scalar entries. For example, in the circuit of FIG. 3, n=3. As a whole, $J_{hb}$ therefore has n(2k+1)×n(2k+1) entries.

A test matrix Z is formed 404 which has the same sparsity structure as the transient Jacobian, but includes a representative scalar entry in place of each (2k+1)×(2k+1) block $A_{ij}$. Thus, the test matrix Z has n rows and n columns of scalar entries. For example, in the circuit of FIG. 3, n=3. The value for a representative entry $z_{ij}$ in the test matrix Z is determined by applying some function to the corresponding block matrix $A_{ij}$. For example, in one embodiment, the representative entry $z_{ij}$ in the test matrix is computed as the norm of the corresponding block matrix $A_{ij}$ in $J_{HB}$ as:

$$z_{ij} = \|A_{ij}\| \quad (22)$$

The test matrix Z should be constructed so that it mimics the properties of $J_{hb}$. For instance, if there is an entry in the transient Jacobian at (i, j)th location where only C matrix entry is present, then the corresponding block in $J_{HB}$ will be $j2\pi f_0 \Omega C_{i,j}$ which is singular. This entry should not be a choice of pivot for the test matrix otherwise the matrix factor of $J_{hb}$ will fail. This can be avoided by introducing numerical zeroes in such locations which will prevent these entries to be used as pivots when factoring the test matrix Z in the following steps.

The test matrix Z is factored 406 into its lower triangular component $L_Z$ and upper triangular component $U_Z$ such that $Z=L_Z U_Z$. This factorization can be efficiently performed by a modern sparse LU solver. The solver, along with factoring the matrix will determine a row and column permutation and a row and column scaling scheme which will minimize the number of fills in factoring the test matrix. Moreover, the LU solver will provide the locations of the zeroes and non-zeros in the L and U matrices of the HB Jacobian.

Given $L_Z$ and $U_Z$, LU factorization can be efficiently performed on $J_{hb}$ to derive the factors L and U of the HB Jacobian. Using the information from the test matrix factorization (i.e. the locations of the zeroes and non-zeroes), the simulation system 100 can solve only for entries in the L and U matrices determined to be the non-zero entries, and bypass the entries determined to be the zero entries. Beginning with a first column j=1, row permutation and row and column scaling are performed 408 on the jth column of matrix $J_{hb}$. Beginning with the first row i=1, if there is a structural non-zero entry at the (i, j)th entry in $U_Z$, then the (i,j)th entry $U_{ij}$ of the upper triangular factor of the HB Jacobian is computed 410 as follows:

$$U_{ij} = A_{ij} - \sum_{k=1}^{i-1} L_{ik} U_{kj} \text{ if } i \le j \qquad (23)$$

Similarly, if there is a structural nonzero at the (i, j)th entry of $L_Z$, then the (I,j)th entry $L_{ij}$ of the lower triangular factor of the HB Jacobian is computed 412 as follows:

$$L_{ij} = \left(A_{ij} - \sum_{k=1}^{j-1} L_{ik} U_{kj}\right) U_{jj}^{-1} \text{ if } i > j \qquad (24)$$

The simulation system 100 then determines 414 if the current row i is less than the total number of rows, and if so, the computations in steps 410 and 412 repeat 420 for each row i of col j. Otherwise, the simulation system 100 determines 416 if the current column j is less than the total number of columns, and if so, steps 408, 410, 412, 414 are repeated 422 for each column j. Once all rows and columns have been processed, the final matrix factors L, U are outputted 418.

The operations in steps 410, 412 can be performed very efficiently using aggressively optimized implementations for the target CPU architecture. For example, in one embodiment a "BLAS" implementation is used as described in Blackford, et al., "*An Updated Set of Linear Algebra Subprograms (BLAS)*." ACM Transactions on Mathematical Software, 28:135-151, 2002, the content of which is incorporated by reference herein. In another embodiment, a LAPACK implementation is used as described in Anderson, et al., "*LAPACK User's Guide*," 3$^{rd}$ ed., Society for Industrial and Applied Mathematics, Philadelphia, Pa., 1999, the content of which is incorporated by reference herein. Furthermore, these BLAS and LAPACK routines are also available in parallel form and multi-threaded versions of these routines can be used to further improve performance as the performance of these basic routines scales almost linearly with the number of processors.

Complexity Analysis

In practice, for improved computation efficiency, matrix $J_{hb}$ need not be constructed explicitly and only the factors L and U are directly computed. During the factorization, the block matrices of $A_{ij}$ can be constructed on the fly and each block is only needed once. Therefore the storage requirement of the direct solver is:

$$(nnzl+nnzu)(2k+1)^2 \qquad (25)$$

where nnzu and nnzl are the number of non-zeroes in U and L respectively. For comparison, in traditional preconditioned Krylov subspace methods, the storage requirement is $2nn_t$ where $n_t$ is the number of time points. The computation complexity of the direct solver is $$O((nnzl^{\alpha_l}+nnzu^{\alpha_u})(2k+1)^3) \qquad (26)$$

where $\alpha_l, \alpha_u > 1$ but are close to 1. The complexity of a conventional Krylov subspace based method is somewhat less straight-forward to express. If a Krylov subspace method converges in 1 iterations, then the complexity of HB matrix vector multiply is:

$$lO((nnzc+nnzg)(2k+1)\log(2k+1)) \qquad (27)$$

where nnzc and nnzg are the number of non-zeroes in C and G respectively. For an Arnoldi based Krylov subspace method, the complexity of running l iterations is $O(l^2 n(2k+1))$. The complexity of applying the preconditioner per iteration is typically $O(nnz^\alpha(2k+1))$.

If the number of Krylov subspace iterations l required to achieve convergence is greater than 2k+1, the direct method can be competitive or significantly superior in performance compared to Krylov subspace methods. For problems with moderate to strong nonlinearities, the number of Krylov subspace iterations can be very large even though the number of harmonics requested is moderate. In these situations, the direct method substantially outperforms the conventional Krylov subspace methods. For many applications, the direct solver method furthermore provides superior CPU time and improved robustness over conventional methods. Additional details of the performance results are described in more detail in Mehrotra, A. and Somani, A., "*A Robust and Efficient Harmonic Balance (HB) Using Direct Solution of HB Jacobian*," Design Automation Conference, 2009, the content of which is incorporated by reference herein.

Direct Solve for Fourier Envelope Analysis

In another embodiment, the direct solve method of FIGS. 2 and 4 can be applied to Fourier envelope analysis problems. When circuits are driven by or respond with signals of widely separated time scales, it is advantageous to view the circuit equations in more than one time scale. Examples of this technique are described in more detail in J. Roychowdhury, "*Efficient methods for simulating highly nonlinear multi-rate circuits*." In Proceedings 34th Design Automation Conference, pages 269-274, 1997, and J. Roychowdhury, "*Analyzing circuits with widely separated time scales using numerical PDE methods*." IEEE Trans. Circuits Sys. I, 48:578-594, May 2001, the contents of which are incorporated by reference herein.

The resulting partial differential equation can be efficiently solved and the circuit response can be derived from the multi-rate solution. A multi-rate partial differential equation (PDE) variation of (1) is given by:

$$\frac{\partial q(\hat{x}(t_1, t_2))}{\partial t_1} + \frac{\partial q(\hat{x}(t_1, t_2))}{\partial t_2} + f(\hat{x}(t_1, t_2)) + \hat{b}(t_1, t_2) = 0 \quad (28)$$

where the convolution term has been omitted. If $x(t_1, t_2)$ is the solution of (28), then it can be shown that $x(t, t)$ is the solution of the original differential algebraic equation (DAE). Fourier envelope assumes that the signals are periodic in $t_2$ and therefore can be expanded in Fourier series as described above in Eq. (2). After following steps substantially similar to Eqs. (3)-(5) above, the following matrix equation is derived:

$$\frac{\partial \mathcal{Q}(t_1)}{\partial t_1} + 2\pi \mathcal{J} f_2 \Omega \mathcal{Q}(t_1) + \mathcal{F}(t_1) + \mathcal{B}(t_1) = 0 \quad (29)$$

The above DAE is discretized using an appropriate linear multistep method (such as Backward Euler) and integrated in $t_1$:

$$\frac{\mathcal{Q}_i - \mathcal{Q}_{i-1}}{h_i} + 2\pi \mathcal{J} f_2 \Omega \mathcal{Q}(t_{1_i}) + \mathcal{F}(t_{1_i}) + \mathcal{B}(t_{1_i}) = 0 \quad (30)$$

Eq. (30) can then be solved using Newton's method. The Jacobian for (30) is of the form:

$$\frac{1}{h_i} C_i + \mathcal{G}_i + 2\pi \mathcal{J} f_2 \Omega \mathcal{C}_i \quad (31)$$

Note that the Fourier envelope Jacobian in (31) is substantially similar to the HB Jacobian except for an additional term $$\frac{1}{h_i} x_i.$$

Therefore the direct factorization technique described above with respect to FIG. 4 can be applied to the Fourier envelope problem described above. In fact, direct solve is ideally suited for this analysis because it is typically performed with one large periodic tone (usually the LO in an RF transceiver), the nonlinearities are strong, and at every envelope step, it usually takes 2-3 Newton iterations to converge.

In one embodiment, a Jacobian bypass technique is used. In this method, the Jacobian matrix is not factored (bypassed) and the previous factors are used to perform triangle solves with L and U. As the number of bypassed Jacobians increases, the total number of Newton iterations increases, but the time taken per Newton iteration reduces because of time savings due to Jacobian bypass.

Jacobian bypass can result in 2-3 times performance improvement over non-bypassed implementation of the direct solver. Performance results are discussed in more detail in Mehrotra, A. and Somani, A., "*A Robust and Efficient Harmonic Balance (HB) Using Direct Solution of HB Jacobian*," Design Automation Conference, 2009, the content of which is incorporated by reference herein.

Preconditioners Based on Direct Solve

Figure 6:
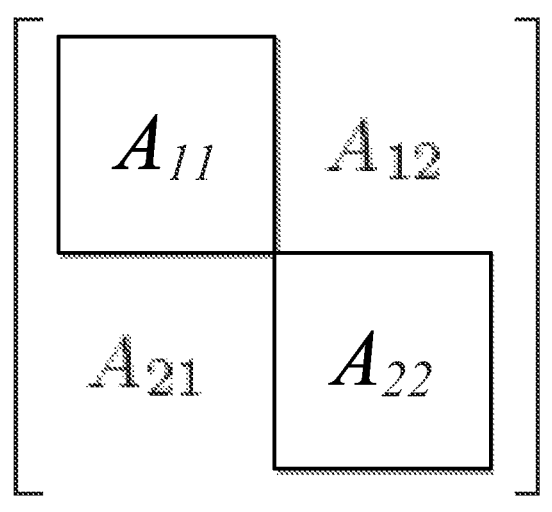

In one embodiment, the HB Jacobian $J_{hb}$ can be segmented into four parts of approximately equal number of harmonics, as shown in FIG. 6. The four portions are solved independently, and the combined solution is used as the result of a preconditioner solve. By recursively applying this method on each sub-problem, the hierarchical problem can be efficiently solved. Examples of a recursive solve technique are described in more detail in Li, et al., "*Efficient harmonic balance simulation using multi-level frequency decomposition*." In IEEE/ACM International Conference on Computer Aided Design, pages 677-682, 2004, and Dong, et al., "*Hierarchical harmonic-balance methods for frequency-domain analog-circuit analysis. IEEE Trans. Computer-Aided Design*," 26:2089-2101, December 2007, the contents of which are incorporated by reference herein.

In an embodiment of the present invention, the direct solve technique of FIG. 4 can be used to solve for each of the segments in the recursive method described above. In contrast to the technique described in Li above, one embodiment of the present invention includes A21 in the preconditioner, i.e., for two segments, 75% of the matrix is included in the preconditioner. For example, to solve for $[b1, b2]^T$ using this preconditioner, the process first solves $A_{11}x_1=b_1$, and then solve $A_{22}x_2=b_2-A_{21}x_1$. This uses an extra matrix vector multiply with $A_B$. $A_{21}x_1$ can be obtained by multiplying $J_{hb}$ with $[x_1, 0]^T$ and taking the second block vector of the product. More generally, if the matrix is divided into l segments then for the ith block row, the summation $$\sum_{j=1}^{i-1} A_{ij} x_j$$

is formed by multiplying $J_{HB}$ with $[x_1, \ldots, x_{i-1}, 0, \ldots]^T$ and taking the result of the ith block row. The inclusion or non-inclusion of the $A_{ij}$ blocks applies only to the preconditioner matrix, and the accuracy of the solution of HB Jacobian is unaffected in both the cases.

The advantage of using direct solve of $A_{11}$ and $A_{22}$ is that these matrices need to be factored only once. In each subsequent Krylov subspace iteration, the process only needs to perform triangle solves with L and U factors of these matrices. This gives significant speed advantage over the preconditioner where $A_{11}$ and $A_{22}$ are also solved using Krylov subspace methods.

Complexity Analysis for Preconditioner-Based Direct Solve

Assuming that the matrix is divided into l segments of approximately equal number of harmonics, the storage requirement of each segment is reduced by the factor $l_2$ but l segments are stored. Hence the overall memory requirement reduces by a factor of l. Similarly the matrix factor time is reduced by $l_2$. l triangle solves are performed at each Krylov iteration. If m iterations are required for Krylov subspace method to converge to the solution, then the total solve time is:

$$\mathcal{O}\left(\text{ml}(nnzu_v^a + nnzl_t^a)\left(\frac{2k+1}{l}\right)^2\right) \quad (32)$$

The number of matrix vector multiplies with the HB Jacobian is m−1. Therefore the overall cost is:

$$\mathcal{O}\left((nnzu_v^a + nnzl_t^a)\left(\frac{2k+1}{l^2}\right)^3\right) + \mathcal{O}\left(m(nnzu_v^a + nnzl_t^a)\left(\frac{2k+1}{l}\right)^2\right) + \quad (33)$$
$$\mathcal{O}(\text{ml}(nnzc + nnzu)(2k+1)\log(2k+1)) + \mathcal{O}(m^2 n(2k+1))$$

This provides a direct trade-off between memory and speed. As l is increased, the memory consumption goes down but m increases which may increase the HB solve time depending how steep the increase in m is. Performance results are discussed in more detail in Mehrotra, A. and Somani, A., "*A Robust and Efficient Harmonic Balance (HB) Using Direct Solution of HB Jacobian,*" Design Automation Conference, 2009, the contents of which is incorporated by reference herein.

Although the present invention has been described above with respect to several embodiments, various modifications can be made within the scope of the present invention. For example, although examples are provided in the context of RF circuits, the described method for efficiently performing harmonic balance is applicable to other areas such as biological systems, chemical systems, dynamic systems, or other systems. In these applications, the system is modeled using an equation of the form of Eq. (1) above. Instead of the variables representing circuit components, they instead represent components of the relevant biological, chemical, or dynamic system. Such an equation can then be solved using the harmonic balance described herein to solve for the unknown variables in the relevant system. Accordingly, the disclosure of the present invention is intended to be illustrative, but not limiting, of the scope of the invention, which is set forth in the following claims.

What is claimed is:

1. A computer-implemented method for simulating a circuit, the method comprising:
    receiving, by a processor, a Jacobian matrix of a non-linear equation representing the circuit under simulation, the Jacobian matrix having n rows of blocks and n columns of blocks, wherein each block $A_{ij}$ comprises a sub-matrix of numerical entries, the Jacobian matrix factorable into a lower triangular component L and an upper triangular component U;
    generating, by the processor, a test matrix Z having n rows and n columns of representative numerical entries, wherein a representative numerical entry $z_{ij}$ is determined as a function of a corresponding block $A_{ij}$ in the Jacobian matrix;
    performing, by the processor, a lower-upper factorization on the test matrix Z to derive a lower triangular component $L_Z$ and an upper triangular component $U_Z$;
    for each non-zero entry in the lower triangular component $L_Z$ of the test matrix Z, determining, by the processor, a corresponding block in the lower triangular component L of the Jacobian matrix;
    for each non-zero entry in the upper triangular component $U_Z$ of the test matrix Z, determining, by the processor, a corresponding block in the upper triangular component U of the Jacobian matrix; and
    outputting the lower triangular component L and the upper triangular component U of the Jacobian matrix.

2. The method of claim 1, further comprising:
    receiving, by an input device, a netlist describing components of a non-linear circuit and connections between the components, the non-linear circuit having at least one initially unknown state variable;
    deriving a harmonic balance equation from the netlist, the harmonic balance equation comprising a frequency domain representation of a system of non-linear equations describing the non-linear circuit; and
    generating the Jacobian matrix for the harmonic balance equation.

3. The method of claim 1, further comprising:
    solving the harmonic balance equation for the at least one initially unknown state variable using the lower L and upper U triangular components in an LU decomposition method; and
    outputting a signal representative of the at least one initially unknown state variable.

4. The method of claim 1, further comprising:
    receiving, by an input device, a parameter of a multi-rate matrix equation representative of a Fourier envelope analysis, the multi-rate matrix equations having at least one initially unknown state variable; and
    generating the Jacobian matrix for the multi-rate matrix equation representative of the Fourier envelope analysis.

5. The method of claim 1, wherein the Jacobian matrix comprises a sub-matrix of a second matrix, the method further comprising:
    determining a preconditioner based at least in part on the lower and upper triangular components L and U of the Jacobian matrix; and
    applying the preconditioner to the second matrix.

6. The method of claim 1, wherein the system of non-linear equations describing the non-linear circuit is in the form:

$$\int_{-\infty}^{t} y(t-s)x(s)ds + \frac{dq(x(t))}{dt} + f(x(t)) + b(t) = 0$$

where x(t) represents the state variables in the circuit, n represents a circuit size, y represents a matrix-valued impulse response function of frequency-domain linear elements of the non-linear circuit, q represents a nonlinear charge and flux storage in the non-linear circuit, f represents memoryless nonlinearities, and b represents time-dependent excitations in the non-linear circuit.

7. A non-transitory computer-readable storage medium storing computer-executable program instructions for simulating a circuit, the computer program instructions when executed by a processor cause the processor to perform steps of:
    receiving a Jacobian matrix of a non-linear equation representing the circuit under simulation, the Jacobian matrix having n rows of blocks and n columns of blocks, wherein each block $A_{ij}$ comprises a sub-matrix of numerical entries, the Jacobian matrix factorable into a lower triangular component L and an upper triangular component U;
    generating a test matrix Z having n rows and n columns of representative numerical entries, wherein a representative numerical entry $z_{ij}$ is determined as a function of a corresponding block $A_{ij}$ in the Jacobian matrix;
    performing a lower-upper factorization on the test matrix Z to derive a lower triangular component $L_Z$ and an upper triangular component $U_Z$;
    for each non-zero entry in the lower triangular component $L_Z$ of the test matrix Z, determining a corresponding block in the lower triangular component L of the Jacobian matrix;
    for each non-zero entry in the lower triangular component $U_Z$ of the test matrix Z, determining a corresponding block in the upper triangular component U of the Jacobian matrix; and
    outputting the lower triangular component L and the upper triangular component U of the Jacobian matrix.

8. The computer-readable storage medium of claim 7, wherein the computer program instructions further cause the processor to perform steps of:
    receiving, by an input device, a netlist describing components of a non-linear circuit and connections between the components, the non-linear circuit having at least one initially unknown state variable;

deriving a harmonic balance equation from the netlist, the harmonic balance equation comprising a frequency domain representation of a system of non-linear equations describing the non-linear circuit; and generating the Jacobian matrix for the harmonic balance equation.

9. The non-transitory computer-readable storage medium of claim 7, wherein the computer program instructions further cause the processor to perform steps of:

solving the harmonic balance equation for the at least one initially unknown state variable using the lower L and upper U triangular components in an LU decomposition method; and outputting a signal representative of the at least one initially unknown state variable.

10. The non-transitory computer-readable storage medium of claim 7, wherein the computer program instructions further cause the processor to perform steps of:

receiving, by an input device, a parameter of a multi-rate matrix equation representative of a Fourier envelope analysis, the multi-rate matrix equations having at least one initially unknown state variable; and generating the Jacobian matrix for the multi-rate matrix equation representative of the Fourier envelope analysis.

11. The non-transitory computer-readable storage medium of claim 7, wherein the Jacobian matrix comprises a submatrix of a second matrix, wherein the computer program instructions further cause the processor to perform steps of:

determining a preconditioner based at least in part on the lower and upper triangular components L and U of the Jacobian matrix; and applying the preconditioner to the second matrix.

12. The computer-readable storage medium of claim 7, wherein the system of non-linear equations describing the non-linear circuit is in the form:

$$\int_{-\infty}^{t} y(t-s)x(s)\,ds + \frac{dq(x(t))}{dt} + f(x(t)) + b(t) = 0$$

where x(t) represents the state variables in the circuit, n represents a circuit size, y represents a matrix-valued impulse response function of frequency-domain linear elements of the non-linear circuit, q represents a nonlinear charge and flux storage in the non-linear circuit, f represents memoryless nonlinearities, and b represents time-dependent excitations in the non-linear circuit.

13. A computer-implemented method for simulating a non-linear circuit, the method comprising:

receiving a Jacobian matrix for a harmonic balance equation describing the non-linear circuit, the harmonic balance equation comprising at least one unknown state variable;

using a test matrix representative of the structure of the Jacobian matrix to determine the locations of zero and non-zero entries in the lower triangular factor L and the upper triangular factor U of the Jacobian matrix;

factoring the Jacobian matrix into the lower triangular factor L and the upper triangular factor U by solving only for entries in the L and U matrices determined to be the non-zero entries, and bypassing the entries determined to be the zero entries; and solving the harmonic balance equation for the at least one unknown state variable using the lower triangular factor L and the upper triangular factor U in an LU decomposition method.

14. The method of claim 13, further comprising:

receiving, by an input device, a netlist describing components of the non-linear circuit and connections between the components; and deriving the harmonic balance equation from the netlist, the harmonic balance equation comprising a frequency domain representation of a system of non-linear equations describing the non-linear circuit.

15. The method of claim 13, wherein the Jacobian matrix has a sparse block matrix structure such that harmonics of a single variable are grouped together in a block.

16. The method of claim 13, wherein the non-linear circuit is characterized by a system of equations in the form:

$$\int_{-\infty}^{t} y(t-s)x(s)\,ds + \frac{dq(x(t))}{dt} + f(x(t)) + b(t) = 0$$

where x(t) represents the state variables in the circuit, n represents a circuit size, y represents a matrix-valued impulse response function of frequency-domain linear elements of the non-linear circuit, q represents a nonlinear charge and flux storage in the non-linear circuit, f represents memoryless nonlinearities, and b represents time-dependent excitations in the non-linear circuit.

17. A computer-readable storage medium storing computer-executable program instructions for simulating a non-linear circuit, the computer program instructions when executed by a processor cause the processor to perform steps of:

receiving a Jacobian matrix for a harmonic balance equation describing the non-linear circuit, the harmonic balance equation comprising at least one unknown state variable;

using a test matrix representative of the structure of the Jacobian matrix to determine the locations of zero and non-zero entries in the lower triangular factor L and the upper triangular factor U of the Jacobian matrix;

factoring the Jacobian matrix into the lower triangular factor L and the upper triangular factor U by solving only for entries in the L and U matrices determined to be the non-zero entries, and bypassing the entries determined to be the zero entries; and solving the harmonic balance equation for the at least one unknown state variable using the lower triangular factor L and the upper triangular factor U in an LU decomposition method.

18. The computer-readable storage medium of claim 17, wherein the computer program instruction further cause the processor to perform steps of:

receiving a netlist describing components of the non-linear circuit and connections between the components; and deriving the harmonic balance equation from the netlist, the harmonic balance equation comprising a frequency domain representation of a system of non-linear equations describing the non-linear circuit.

19. The computer-readable storage medium of claim 17, wherein the Jacobian matrix has a sparse block matrix structure such that harmonics of a single variable are grouped together in a block.

20. The computer-readable storage medium of claim 17, wherein the non-linear circuit is characterized by a system of equations in the form:

$$\int_{-\infty}^{t} y(t-s)x(s)\,ds + \frac{dq(x(t))}{dt} + f(x(t)) + b(t) = 0$$

where x(t) represents the state variables in the circuit, n represents a circuit size, y represents a matrix-valued impulse response function of frequency-domain linear elements of the non-linear circuit, q represents a nonlinear charge and flux storage in the non-linear circuit, f represents memoryless nonlinearities, and b represents time-dependent excitations in the non-linear circuit.

* * * * *